（12) United States Patent
Neal

(10) Patent No.: US 9,109,289 B2
(45) Date of Patent: Aug. 18, 2015

(54) MANIPULATOR FOR COATING APPLICATION

(75) Inventor: James W. Neal, Ellington, CT (US)

(73) Assignee: United Technologies Corporation, Hartford, CT (US)

(\*) Notice: Subject to any disclaimer, the term of this patent is extended or adjusted under 35 U.S.C. 154(b) by 1073 days.

(21) Appl. No.: 13/169,647

(22) Filed: Jun. 27, 2011

(65) Prior Publication Data

US 2012/0329595 A1 Dec. 27, 2012

(51) Int. Cl.
| | |
|---|---|
| *F16H 57/08* | (2006.01) |
| *C23C 14/50* | (2006.01) |
| *B25J 1/00* | (2006.01) |
| *F16L 35/00* | (2006.01) |
| *F16H 57/033* | (2012.01) |
| *F01D 5/28* | (2006.01) |
| *F01D 25/28* | (2006.01) |
| *F16H 1/28* | (2006.01) |

(52) U.S. Cl.
CPC ............ *C23C 14/505* (2013.01); *B25J 1/00* (2013.01); *F16H 57/033* (2013.01); *F16L 35/00* (2013.01); *F01D 5/288* (2013.01); *F01D 25/285* (2013.01); *F05D 2230/31* (2013.01); *F16H 1/28* (2013.01)

(58) Field of Classification Search
CPC ............ F16H 1/06; F16H 1/20; F16H 1/28; Y10T 74/1933; Y10T 74/19349; C23C 14/505
See application file for complete search history.

(56) References Cited

U.S. PATENT DOCUMENTS

| | | | |
|---|---|---|---|
| 4,485,759 A | 12/1984 | Brandolf | |
| 4,563,914 A * | 1/1986 | Miller | 475/80 |
| 5,106,346 A | 4/1992 | Locher et al. | |
| 5,124,013 A | 6/1992 | Seddon et al. | |
| 5,997,947 A | 12/1999 | Burns et al. | |
| 6,056,826 A | 5/2000 | Rick et al. | |
| 6,620,254 B2 | 9/2003 | Zaech et al. | |
| 6,649,208 B2 * | 11/2003 | Rodgers | 427/10 |
| 6,852,202 B2 | 2/2005 | Miller et al. | |
| 7,081,166 B2 | 7/2006 | Zaech et al. | |
| 7,790,004 B2 | 9/2010 | Seddon | |
| 2004/0065262 A1 | 4/2004 | Burns et al. | |

(Continued)

FOREIGN PATENT DOCUMENTS

JP S63153518 U 10/1988

OTHER PUBLICATIONS

Extended European Search Report from EP Application Serial No. 12173821.5, Dated Feb. 3, 2015, 6 pages.

*Primary Examiner* — Huan Le

(74) *Attorney, Agent, or Firm* — Kinney & Lange, P.A.

(57) ABSTRACT

A coating system includes a coating source and a planetary manipulator assembly that includes a first driveshaft capable of receiving rotational input, a sun gear rotationally fixed to the first driveshaft, a planetary gear engaged with the sun gear, a second driveshaft rotationally fixed to the planetary gear such that torque is transmitted from the sun gear to the planetary gear, a support shaft operatively engaged with the second driveshaft, a carrier body supporting the planetary gear relative to the sun gear, a third driveshaft capable of receiving rotational input, and a drive gear rotationally fixed to the third driveshaft. The support shaft is arranged substantially perpendicular to the second driveshaft. The carrier body is rotatable by the drive gear about a common axis with the sun gear, and rotation of the carrier body rotates the planetary gear and the second driveshaft about the sun gear.

18 Claims, 2 Drawing Sheets

(56) References Cited

U.S. PATENT DOCUMENTS

| | | |
|---|---|---|
| 2005/0072266 A1 | 4/2005 | Zaech et al. |
| 2009/0186159 A1 | 7/2009 | Mitchell et al. |
| 2009/0258141 A1 | 10/2009 | Mitchell et al. |
| 2009/0258151 A1 | 10/2009 | Mitchell et al. |
| 2009/0280244 A1 | 11/2009 | Mitchell et al. |
| 2011/0171390 A1 | 7/2011 | Palmieri et al. |
| 2011/0223356 A1 | 9/2011 | Gero et al. |

* cited by examiner

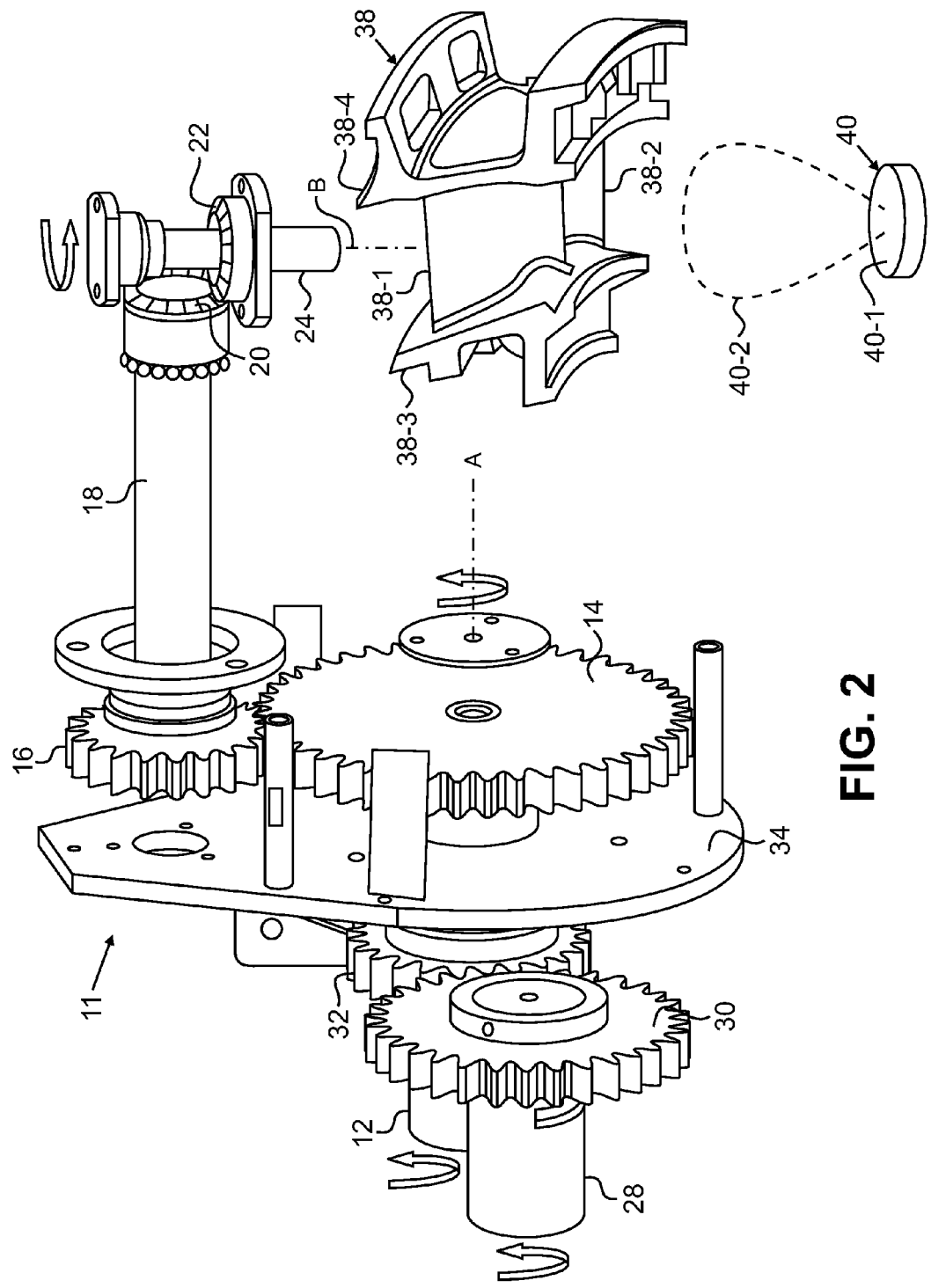

MANIPULATOR FOR COATING APPLICATION

BACKGROUND

The present invention relates to coating systems for applying coatings to workpieces, and more particularly to coating systems that include a manipulator having planetary gearing.

In order to apply coatings to workpieces with desirable coating distribution, manipulators can be used to move the workpiece within a stream, plume or cloud of coating material. Such manipulators allow more even coating thickness distribution on various surfaces of workpieces, especially workpieces with relatively complex geometries and hard-to-reach (e.g., non-line-of-sight) areas. Gear-driven manipulators exist, including those with gear-driven arms that rotate and move upward and downward at up to +/−45° in a "butterfly" movement to provide one complete axis of rotation and one partial axis of rotation.

Gas turbine engines include numerous components with a variety of coatings. For example, gas turbine engines often include vane segments, such as "doublets" with a pair of airfoils extending between inner and outer platforms. Such doublets can include thermal barrier coatings (TBCs) made of ceramics or other materials, as well as environmental or other coatings. The configuration of typical vane doublets with highly contoured end walls can make coating uniform coating distribution difficult, including in the throat area between the airfoils.

Therefore, it is desired to provide an alternative coating system having an alternative workpiece manipulator.

SUMMARY

A coating system according to the present invention includes a coating source and a planetary manipulator assembly that includes a first driveshaft capable of receiving rotational input, a sun gear rotationally fixed to the first driveshaft, a planetary gear engaged with the sun gear, a second driveshaft rotationally fixed to the planetary gear such that torque is transmitted from the sun gear to the planetary gear, a support shaft operatively engaged with the second driveshaft, a carrier body supporting the planetary gear relative to the sun gear, a third driveshaft capable of receiving rotational input, and a drive gear rotationally fixed to the third driveshaft. The support shaft is arranged substantially perpendicular to the second driveshaft. The carrier body is rotatable by the drive gear about a common axis with the sun gear, and rotation of the carrier body rotates the planetary gear and the second driveshaft about the sun gear.

BRIEF DESCRIPTION OF THE DRAWINGS

FIG. 2 is a perspective view of a portion of the coating application system of FIG. 1.

Figure 1:
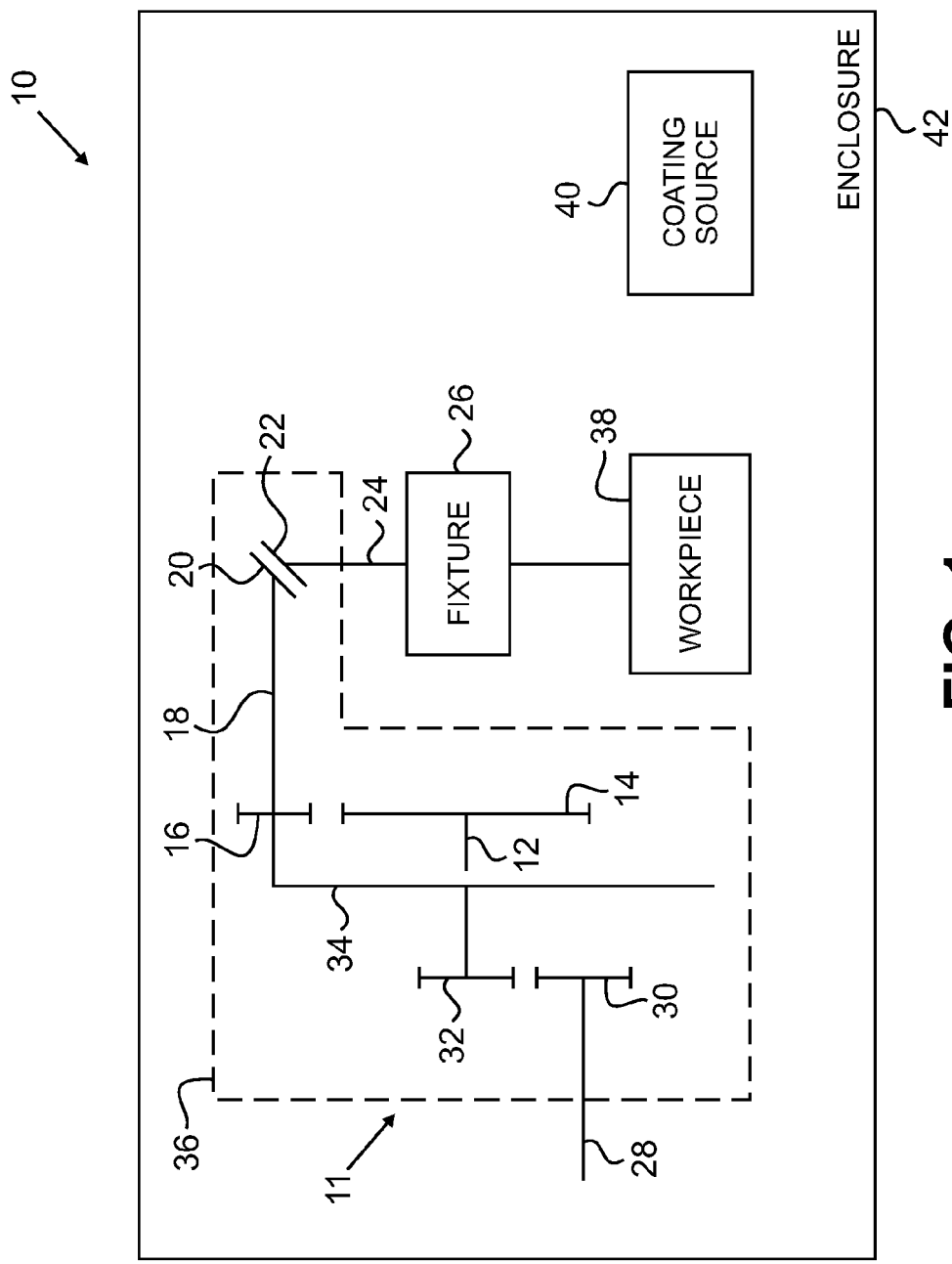
FIG. 1 is a schematic illustration of an embodiment of a coating application system according to the present invention.

While the above-identified drawing figures set forth an embodiment of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale.

DETAILED DESCRIPTION

It is desired to provide a workpiece manipulator for a coating application system that allows for workpiece movement that approaches random movement. More random workpiece movement facilitates more even coating application and resultant thickness distribution. According to the present invention, a workpiece manipulator assembly is provided that utilizes planetary movement to provide pseudo- or near-random part movement to provide desirable coating distribution. The system of the present invention can be utilized to provide electron beam physical vapor deposition (EB-PVD) application of thermal barrier coatings (TBCs) to gas turbine engine components, as well as to provide a variety of other types of coating materials with a variety of different coating application methods to desired workpieces.

It has been discovered that movement of coating delivery mechanisms (e.g., coating sprayers for use with large workpieces) can produce undesirable flow effects in material supply conduits. Therefore, improved part manipulation according to the present invention without reliance on coating delivery mechanism manipulation allows for consistent coating application without dependence upon particular coating delivery mechanisms. Various features and benefits of the present invention will be appreciated by those of ordinary skill in the art in view of the figures and the description that follows.

FIG. 1 is a schematic illustration of an embodiment of a coating application system 10, and FIG. 2 is a perspective view of a portion of the coating application system 10. In the illustrated embodiment, the system 10 includes a manipulator assembly 11 that includes a driveshaft 12, a sun gear 14, a planetary gear 16, a driveshaft 18, bevel gears 20 and 22, a support shaft (or spindle) 24, a fixture 26, a driveshaft 28, a drive gear 30, a carrier gear 32, a carrier body 34, and a housing 36. The manipulator assembly 11 can be used to hold and manipulate a workpiece 38 (e.g., a gas turbine engine vane doublet) for application of a coating delivered by a coating source 40. Portions or all of the manipulator assembly 11, workpiece 38 and the coating source 40 can be positioned within an enclosure 42.

In one embodiment, a geartrain defined by the manipulator assembly 11 can be configured as follows. The driveshaft 12 is rotationally fixed to the sun gear 14 for common rotation about an axis A. The sun gear 14 is engaged with the planetary gear 16, such that rotation of the sun gear 14 rotates the planetary gear 16. In one embodiment a gear ratio of approximately 2.5:1 can be used between the planetary gear 16 and the sun gear 14, though any desired gear ratio can be used in alternative embodiments. The driveshaft 18 is rotationally fixed to the planetary gear 16 and rotates with the planetary gear 16. The driveshaft 18 is arranged parallel to the driveshaft 12. The bevel gear 20 is fixed to the driveshaft 18, and the bevel gear 22 is fixed to the support shaft 24. The bevel gears 20 and 22 engage each other to transmit torque between the driveshaft 18 and the support shaft 24. The fixture 26 is supported at a distal end of the support shaft 24, opposite the bevel gear 22. The shaft 28 is arranged parallel and adjacent to the shaft 12. The drive gear 30 is rotationally fixed to the shaft 28 for common rotation. The carrier gear 32 can be rotatably supported on the shaft 12 about the axis A, with the carrier gear 32 configured to allow rotation independent of the shaft 12. Drive gear 30 and the carrier gear 32 engage each other to transmit torque. The carrier gear 32 is rotationally fixed to the carrier body 34. The driveshaft 12 can pass through the carrier body 34, but the carrier body 34 is rotationally independent from the driveshaft 12. The planetary gear 16 is supported and carried by the carrier body 34, though the planetary gear 16 can rotate relative to the carrier body 34. Rotation of the carrier body 34 about the axis A causes the planetary gear 16 to travel about a circumference of the sun gear 14 (about the axis A). The housing 36 can enclose components of the manipulator assembly 11 to shield them from coating materials and help prevent coating material accumulation on sensitive gears, etc. of the assembly 11.

The fixture 26 can engage and retain at least one workpiece 38, and can have any suitable configuration to secure one or more desired workpieces. In FIG. 2, the workpiece 38 is shown exploded relative to the support shaft 24, and the fixture 26 is omitted for simplicity. As shown in the embodiment of FIG. 2, the workpiece 38 is a gas turbine engine vane segment "doublet" having a pair of airfoils 38-1 and 38-2 extending between an inner platform 38-3 and an outer platform 38-4. The fixture 26 supports the vane segment workpiece 38 with the support shaft 24 positioned at a midpoint located in between the airfoils 38-1 and 38-2 and in between the inner and outer platforms 38-3 and 38-4. In general, the workpiece 38 can be positioned relative to the support shaft 24 to provide optimal line-of-sight positioning relative to one or more axes of movement and a coating source 40.

The coating source 40 can be an EB-PVD assembly with a material pool 40-1 that can produce a coating vapor plume 40-2 directed toward the workpiece 38. Any conventional EB-PVD assembly can be used. In the illustrated embodiment, the coating plume 40-2 can extend toward the workpiece 38 in a direction generally perpendicular to the axis A and aligned with a plane in which the support arm 24 moves, in order to deliver vaporized coating material to the workpiece 38. Those of ordinary skill in the art should recognize that the EB-PVD system described herein is but one example of a configuration of the coating source 40, and in alternative embodiment other types of coating delivery techniques and systems can be utilized.

The enclosure 42 can be provided to surround at least portions of the manipulator assembly 11, the workpiece 38 and the coating source 40. It should be recognized that portions of those components, particularly portions of the manipulator assembly 11 and the coating source 40 can extend outside the enclosure 42.

During operation, torque can be selectively provided to the driveshafts 12 and 28 to provide rotational input to the manipulation assembly 11. One or more conventional motors or other mechanisms (not shown) can be used to provide torque input to the driveshafts 12 and 28, which can be rotated independently at the same speed or different speeds. The driveshaft 12 rotates the sun gear 14 about the axis A. The sun gear 14 transmits torque to the planetary gear 16, which causes the associated driveshaft 18 to rotate. The bevel gears 20 and 22 transmit torque from the shaft 18 to the support shaft 24, which rotates about an axis B perpendicular to the axis A. In addition, the driveshaft 28 rotates the drive gear 30, which engages the carrier gear 32 thereby rotating the carrier body 34. The planetary gear 16 and the driveshaft 18, as well as the support shaft 24 and the workpiece 38 carried at the end of the support shaft 24, are moved around the circumference of the sun gear 14 by rotation of the carrier body 34 about the axis A. Coating material can be delivered from the coating source 40 while the workpiece 38 is manipulated by the manipulation assembly 11. Manipulation of the assembly 11 tends to cause end-to-end rotational movement of the inner and outer platforms 38-3 and 38-4 of the workpiece 38 about the axis B, with additional rotation (including orbital movement) in relation to the axis A. The movement of the workpiece 38 allows the coating plume 40-2 to tend to focus on the airfoils 38-1 and 38-2 and adjacent surfaces of the platforms 38-3 and 38-4 while reducing the amount of coating directed to non-flowpath-boundary surfaces of the platforms 38-3 and 38-4. It should be noted that the particular orientation of the workpiece 38 relative to the coating plume 40-2 shown in FIG. 2 would only occur momentarily during operation. In general, the movement of the workpiece 38 while the manipulator assembly 11 operates approaches or approximates random movement. It should also be noted that manipulation movement can be adjusted to include dwell times, during which movement of the workpiece 38 is slowed or stopped to increase expose to the coating plume 40-2 at a particular orientation.

It should be appreciated that exact workpiece orientation on a given support shaft, as well as manipulation angles and dwell times can be adjusted as desired for particular applications to optimize coating thicknesses and coating microstructure (e.g., vertical columns) in difficult to coat areas. Workpiece orientation is driven in large part by workpiece configuration, and the manipulation angles and dwell positions can be prioritized by the amount of coating need in each area on a particular part (e.g., where more thermal protection is needed, more TBC is applied). For instance, in some embodiments, more coating may be applied to an inner platform than an outer platform of a gas turbine engine vane segment because the inner platform runs hotter than the outer platform during engine operation.

Any relative terms or terms of degree used herein, such as "substantially", "approximately", "essentially", "generally" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations and the like.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. For example, a workpiece manipulator according to the present invention can be used in conjunction with coating supply manipulation, and can be utilized with a variety of different types of coatings and coating delivery mechanisms. Moreover, in further embodiments, one or more additional support arms, with additional associated planetary gears, shaft and bevel gears can be engaged with the sun gear to support and manipulate additional workpieces simultaneously. Therefore, it is intended that the invention not be limited to the particular embodiment(s) disclosed, but that the invention will include all embodiments falling within the scope of the appended claims.

The invention claimed is:
1. A coating system comprising:
    a planetary manipulator assembly comprising:
        a first driveshaft capable of receiving rotational input;
        a sun gear rotationally fixed to the first driveshaft for rotation therewith;
        a planetary gear engaged with the sun gear;

a second driveshaft rotationally fixed to the planetary gear for rotation therewith, such that torque is transmitted from the sun gear to the planetary gear to rotate the second driveshaft;

a support shaft operatively engaged with the second driveshaft, wherein the support shaft is arranged substantially perpendicular to the second driveshaft;

a carrier body supporting the planetary gear relative to the sun gear, wherein the carrier body is rotatable about a common axis with the sun gear, and wherein rotation of the carrier body rotates the planetary gear and the second driveshaft about the sun gear;

a third driveshaft capable of receiving rotational input; and a drive gear rotationally fixed to the third driveshaft for rotation therewith, wherein rotation of the drive gear rotates the carrier body; and a coating source positioned in operative proximity to the planetary manipulator assembly.

2. The system of claim 1, wherein the first driveshaft and the second driveshaft are arranged parallel to each other.

3. The system of claim 1, wherein the first driveshaft and the third driveshaft are arranged parallel to each other.

4. The system of claim 1 and further comprising:
bevel gears that provide a rotational engagement between the second driveshaft and the support shaft.

5. The system of claim 1 and further comprising:
a manipulator housing for shielding components of the planetary manipulator assembly from coating material from the coating source.

6. The system of claim 1, wherein the coating source comprises an electron beam physical vapor deposition assembly.

7. The system of claim 1 and further comprising:
a carrier gear rotationally fixed to the carrier body and engaged with the drive gear.

8. The system of claim 7, wherein the carrier gear is rotationally supported on the first driveshaft and capable of rotation independent of the first driveshaft.

9. The system of claim 1 and further comprising:
a workpiece support fixture secured to the support shaft.

10. The system of claim 9 and further comprising:
a gas turbine engine vane segment workpiece having a pair of airfoils extending between an inner platform and an outer platform, wherein the fixture supports the vane segment workpiece with the support shaft of the planetary manipulator assembly positioned at a midpoint located in between the airfoils and in between the inner and outer platforms.

11. A method of manipulating a workpiece for coating application, the method comprising:
rotating a sun gear about a first axis;
rotating a planetary gear and associated shaft using the sun gear;
rotating a support shaft using the planetary gear and the associated shaft, wherein the support shaft rotates about a second axis that is perpendicular to the first axis;
rotating a carrier body to move the planetary gear and the associated shaft about a circumference of the sun gear;
carrying a workpiece at a distal end of the support shaft; and
delivering a coating material to the workpiece.

12. The method of claim 11, wherein the coating material is delivered in a direction substantially perpendicular to the first axis.

13. A coating system comprising:
a planetary manipulator assembly comprising:
a first driveshaft capable of receiving rotational input;
a sun gear rotationally fixed to the first driveshaft for rotation therewith;
a planetary gear engaged with the sun gear;
a second driveshaft rotationally fixed to the planetary gear for rotation therewith, such that such that torque is transmitted from the sun gear to the planetary gear to rotate the second driveshaft, wherein the first driveshaft and the second driveshaft are arranged parallel to each other;
a support shaft operatively engaged with the second driveshaft, wherein the support shaft is arranged substantially perpendicular to the second driveshaft;
bevel gears that provide a rotational engagement between the second driveshaft and the support shaft;
a carrier body supporting the planetary gear relative to the sun gear, wherein the carrier body is rotatable about a common axis with the sun gear, and wherein rotation of the carrier body rotates the planetary gear and the second driveshaft about the sun gear;
a third driveshaft capable of receiving rotational input, wherein the first driveshaft and the third driveshaft are arranged parallel to each other;
a drive gear rotationally fixed to the third driveshaft for rotation therewith, wherein rotation of the drive gear rotates the carrier body; and
a carrier gear rotationally fixed to the carrier body and engaged with the drive gear; and
a coating source positioned in operative proximity to the planetary manipulator assembly.

14. The system of claim 13, wherein the carrier gear is rotationally supported on the first driveshaft and capable of rotation independent of the first driveshaft.

15. The system of claim 13 and further comprising:
a manipulator housing for shielding components of the planetary manipulator assembly from coating material from the coating source.

16. The system of claim 13, wherein the coating source comprises an electron beam physical vapor deposition assembly.

17. The system of claim 13 and further comprising:
a workpiece support fixture secured to the support shaft.

18. The system of claim 17 and further comprising:
a gas turbine engine vane segment workpiece having a pair of airfoils extending between an inner platform and an outer platform, wherein the fixture supports the vane segment workpiece with the support shaft of the planetary manipulator assembly positioned at a midpoint located in between the airfoils and in between the inner and outer platforms.

* * * * *